(12) United States Patent
Hsieh (10) Patent No.: US 8,698,174 B2
(45) Date of Patent: Apr. 15, 2014

(54) SEMICONDUCTOR LIGHT EMITTING DEVICE

(75) Inventor: Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 350 days.

(21) Appl. No.: 11/785,124

(22) Filed: Apr. 13, 2007

(65) Prior Publication Data

US 2007/0241356 A1 Oct. 18, 2007

(30) Foreign Application Priority Data

Apr. 13, 2006 (TW) .............................. 95113326 A (51) Int. Cl.
*H01L 33/00* (2010.01)

(52) U.S. Cl.
USPC ..................................... 257/98; 257/E33.071

(58) Field of Classification Search
USPC ........ 257/13, 79, 80, 81, 82, 98, 95, E33.071, 257/E33.072
See application file for complete search history.

(56) References Cited

U.S. PATENT DOCUMENTS

| | | | | |
|---|---|---|---|---|
| 4,153,905 A * | 5/1979 | Charmakadze et al. | ......... | 257/30 |
| 5,714,014 A * | 2/1998 | Horikawa | ........................ | 148/33 |
| 5,779,924 A * | 7/1998 | Krames et al. | .................. | 216/24 |
| 6,396,082 B1 * | 5/2002 | Fukasawa et al. | .............. | 257/79 |
| 6,603,151 B2 * | 8/2003 | Lin et al. | ........................ | 257/98 |
| 6,646,292 B2 * | 11/2003 | Steigerwald et al. | ......... | 257/103 |
| 6,649,440 B1 | 11/2003 | Krames et al. | | |
| 6,717,711 B2 * | 4/2004 | Lin et al. | ........................ | 359/245 |
| 6,803,603 B1 * | 10/2004 | Nitta et al. | ........................ | 257/79 |
| 6,815,312 B2 * | 11/2004 | Furukawa et al. | ............. | 438/455 |
| 6,815,730 B2 | 11/2004 | Yamada | | |
| 6,835,960 B2 * | 12/2004 | Lin et al. | ........................ | 257/81 |
| 6,867,426 B2 | 3/2005 | Hsieh et al. | | |
| 6,897,488 B2 * | 5/2005 | Baur et al. | ........................ | 257/95 |
| 6,969,627 B2 * | 11/2005 | Pan et al. | ........................ | 438/39 |
| 6,998,281 B2 * | 2/2006 | Taskar et al. | .................... | 438/29 |
| 7,019,330 B2 * | 3/2006 | Ludowise | ........................ | 257/79 |
| 7,070,304 B2 * | 7/2006 | Imai | ............................. | 362/267 |
| 7,154,121 B2 * | 12/2006 | Hsieh et al. | ..................... | 257/79 |
| 7,208,752 B2 * | 4/2007 | Lai et al. | ......................... | 257/13 |
| 2004/0119084 A1 * | 6/2004 | Hsieh et al. | ..................... | 257/98 |
| 2004/0251828 A1 * | 12/2004 | Tsukamoto et al. | .......... | 313/512 |
| 2005/0156189 A1 * | 7/2005 | Deguchi et al. | ............... | 257/103 |
| 2005/0253157 A1 * | 11/2005 | Ohashi et al. | ................... | 257/95 |
| 2006/0038195 A1 * | 2/2006 | Pan et al. | ........................ | 257/98 |

FOREIGN PATENT DOCUMENTS

| | | |
|---|---|---|
| CN | 1473364 | 2/2004 |
| CN | 1674306 | 9/2005 |
| CN | 2726129 | 9/2005 |
| TW | 434918 | 5/2001 |
| TW | 535307 | 6/2003 |
| TW | 200520055 A | 6/2005 |

(Continued)

*Primary Examiner* — Long K Tran
*Assistant Examiner* — Jordan Klein
(74) *Attorney, Agent, or Firm* — Bacon & Thomas, PLLC (57) ABSTRACT

This invention relates to a semiconductor light-emitting device including a semiconductor light-emitting chip and a transparent carrier. The semiconductor light-emitting chip includes an active layer and transparent substrate. The active layer emits light under a bias. At least a portion of the light emitted from the active layer enters into the transparent carrier through the transparent substrate. The semiconductor light-emitting chip is coupled to the transparent carrier through the transparent substrate. The area of the transparent carrier is larger than that of the active layer.

20 Claims, 10 Drawing Sheets

(56) References Cited

FOREIGN PATENT DOCUMENTS

| TW | 200532947 A | 10/2005 |
| TW | 1245434 | 12/2005 |
| TW | I252597 | 4/2006 |

\* cited by examiner

FIG 6

SEMICONDUCTOR LIGHT EMITTING DEVICE

REFERENCE TO RELATED APPLICATION

The present application claims the right of priority based on Taiwan Application Serial Number 095113326, filed on Apr. 13, 2006, the disclosure of which incorporated herein by reference in its entirety.

TECHNICAL FIELD

This invention relates to a light-emitting semiconductor device and more particularly to a semiconductor light-emitting device with a light extraction region, where the cross-sectional area of the light extraction region is larger than that of an active layer.

BACKGROUND

A light-emitting diode (LED) is a solid-state semiconductor element, which at least comprises one p-n junction that is formed between a p-type semiconductor layer and an n-type semiconductor layer. When the p-n junction receives certain bias, holes in the p-type semiconductor layer and electrons in the n-type semiconductor layer combine to emit light. The region where light is produced is called an active region. The materials of the p-n junction determine the color of the light emitted inform the active region. For example, LEDs of AlGaInP series emit red light to green light, and LEDs of III-V nitride series emits green light to ultraviolet light.

In general, structures of the active layers comprise single heterostructure (SH), double heterostructure (DH), double-side double heterostructure (DDH), multi-quantum well (MQW), etc. However, such structures still obey the mechanism of the p-n junction. The structure of a commercialized LED production, besides the p-n junction, comprises a growth substrate, a buffer layer, electrodes, a reflection layer, conductive wires, and/or a phosphor, etc.

The light produced in the active layer goes omnidirectionally. However, users usually need the light with specific directions only, so the reflection layer and mirror are adopted to reflect a portion of light. In addition, the difference of the refraction coefficients between LED materials and environment mediums results in that light illuminating on the boundary of the LED undergoes total reflection over a particular incident angle. Generally, it is difficult to prevent each of the reflected light beams from being re-reflected inside the LED.

Figure 1A:
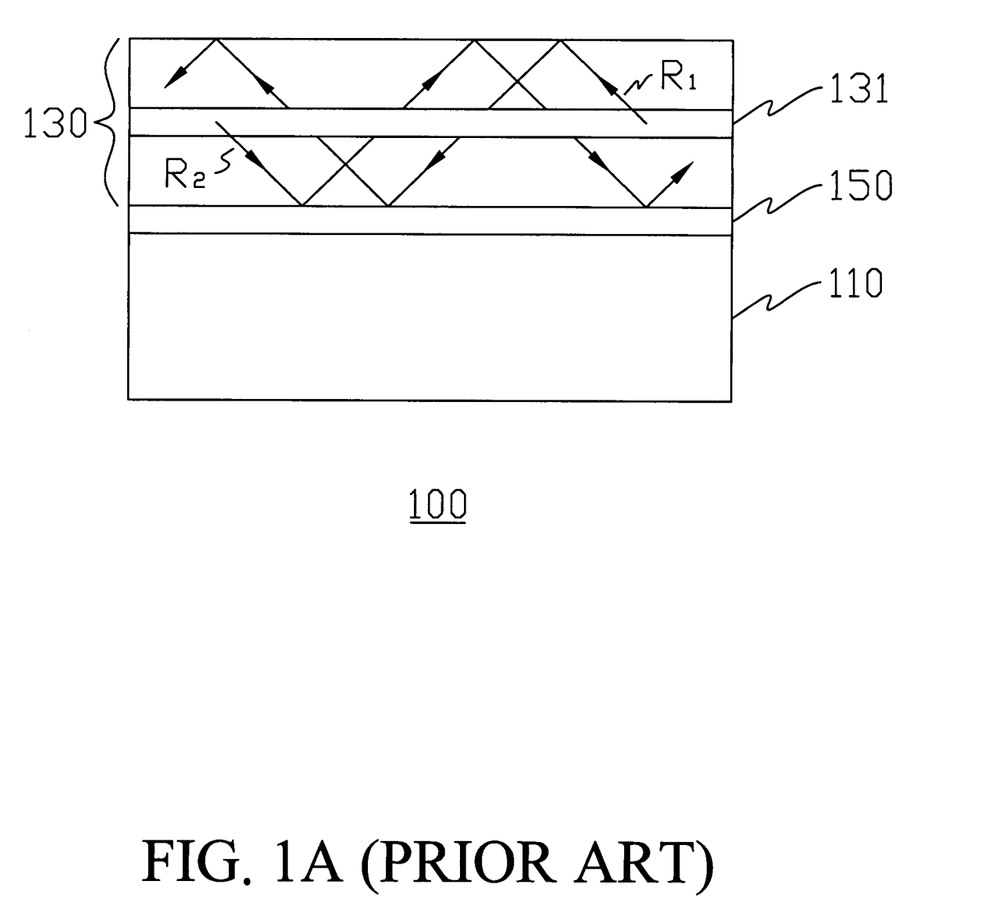
FIGS. 1A and 1B illustrate light paths in two types of prior art LEDs.

Referring to FIG. 1A, a prior art LED 100 includes a substrate 110 and epitaxial layers 130. The epitaxial layers 130 include an active layer 131. The active layer 131 emits light omnidirectionally when a bias is applied thereon. A reflection layer 150 is formed between the epitaxial layers 130 and the substrate 110 to reflect the light from the active layer 131.

A first ray R1 emits toward the upper side of the LED 100. When the refraction coefficient of the environment medium is less than that of the LED 100 and the incident angle is larger than the critical angle, the first ray R1 is reflected totally on the boundary of the epitaxial layers 130 toward the inside of the epitaxial layers 130. When the first ray R1 passes through the active layer 131, a portion of the first ray R1 is absorbed by the active layer 131. The other portion of the first ray R1 proceeds toward the reflection layer 150 and is reflected upward to pass through the active layer 131 again. Therefore, the first ray R1 oscillates in the epitaxial layers 130 and passes through the active layer 131 repeatedly, then is gradually absorbed. Under the same mechanism, a second ray R2 emitting to the underside of LED 100 oscillates in the epitaxial layers 130 and passes through the active layer 131 repeatedly, then is absorbed gradually as well.

Figure 1B:
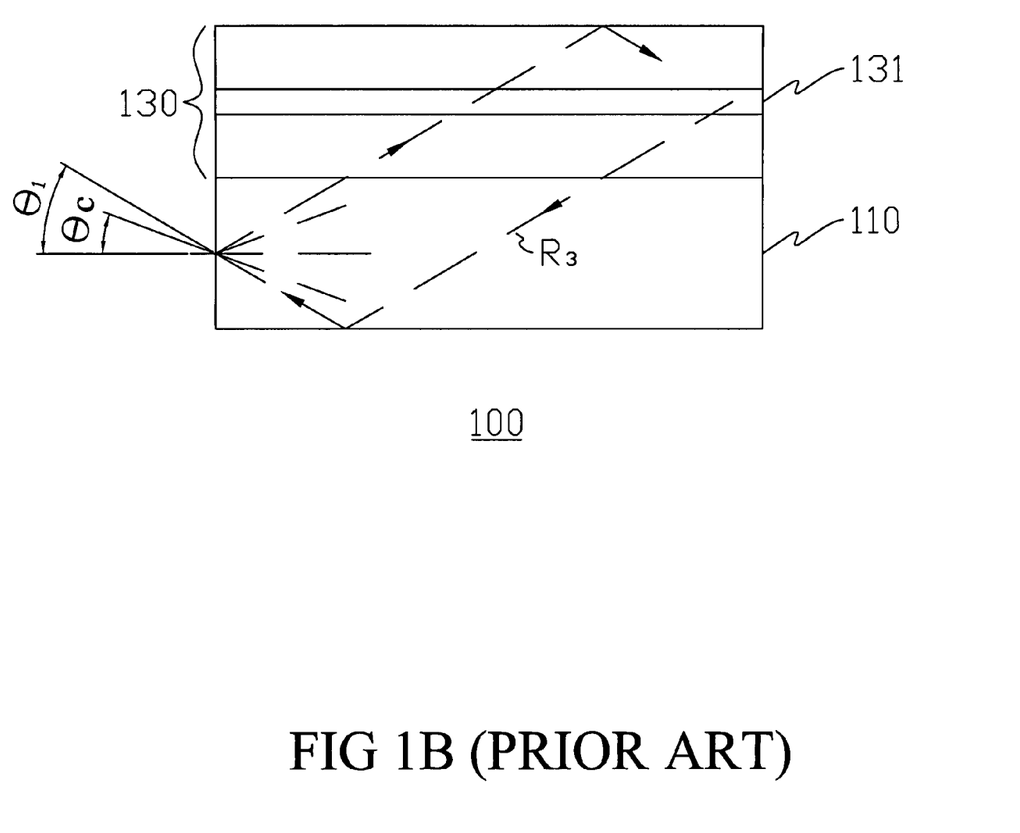

Referring to FIG. 1B, there is no reflection layer between the substrate 110 of the LED 100 and the epitaxial layers 130, and the substrate 110 is transparent relative to the light emitted from the active layer 131. There is a mirror layer (not shown) or just air beneath the substrate 110. If a third ray R3 reflected form the underside of the substrate 110 illuminates the lateral wall of the substrate 110 with an incident angle $\Theta_I$ larger than the critical angle $\Theta_C$, it will be reflected to inside of the epitaxial layers 130. The active layer 131 absorbs a portion of the third ray R3 back to the epitaxial layers. As described above, the third ray R3 is possible to be totally reflected from the margin of the epitaxial layers 130 to the inside of the epitaxial layers 130, and oscillates in the epitaxial layers 130 as well as passes the active layer 131, then is gradually absorbed. The light absorbed by the active layer 131 definitely reduces the light extraction efficiency of the LED 100 to a certain extent.

SUMMARY OF THE INVENTION

This invention provides a semiconductor light-emitting device and a LED encapsulant structure, for reducing the light absorbed by an active layer.

The semiconductor light-emitting device comprises a light-emitting structure and a transparent carrier. The light-emitting structure at least comprises the active layer composed of two different semiconductor layers and a transparent substrate. The transparent carrier is coupled to the light-emitting structure on one side of the transparent substrate, and the area of the transparent carrier is larger than that of the active layer. The semiconductor layers emit light when a bias is applied. A portion of the light emits into the transparent carrier through the transparent substrate. The transparent carrier enhances light extraction efficiency of the light-emitting structure.

The LED encapsulant structure at least comprises the transparent carrier, a base, an anode support, and a cathode support. The transparent carrier is fixed on the base. Alternatively, a reflection structure can be set on the intermediate between the transparent carrier and the base. The transparent carrier is employed to load the LED chip, and the area of the transparent carrier is larger than that of the active layer in the LED chip. The anode and the cathode of the LED chip electrically connect to the anode support and the cathode support respectively.

DETAILED DESCRIPTION OF THE PREFERRED EMBODIMENTS

Figure 2A:
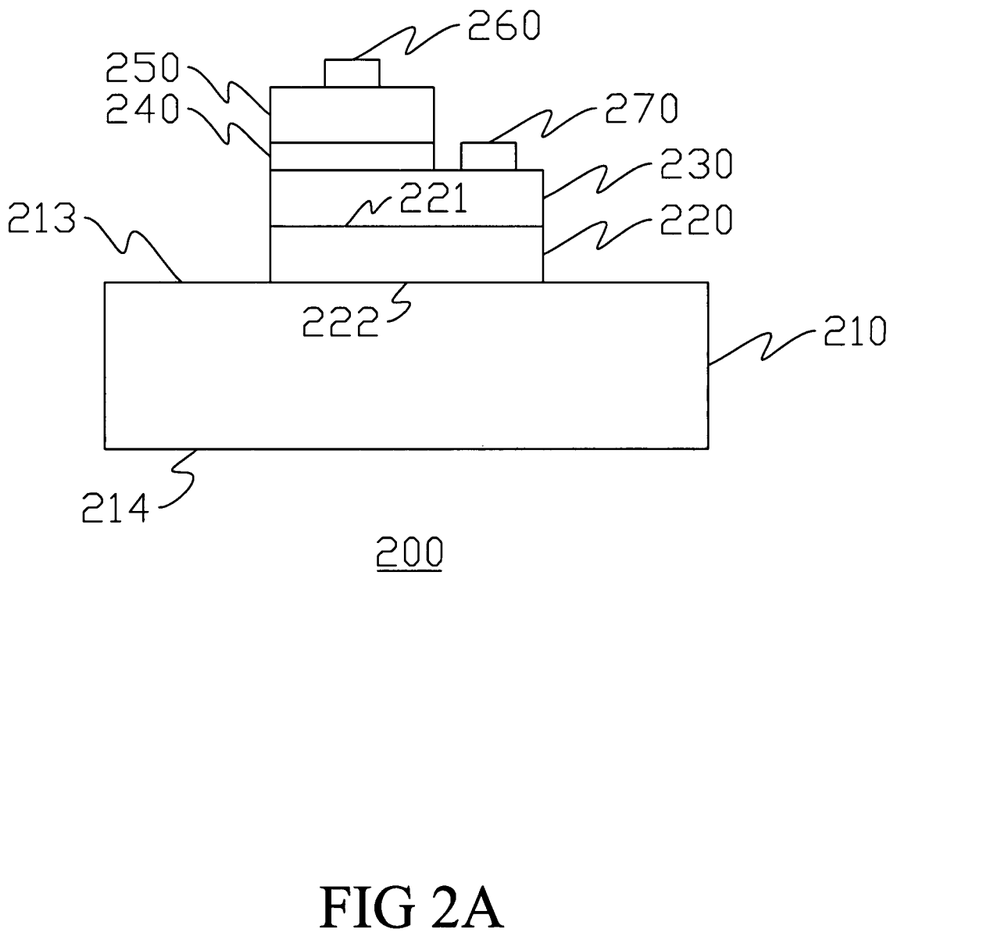
FIG. 2A is a cross-sectional view of a light-emitting semiconductor device in accordance with an embodiment of the present invention.

FIG. 2A shows that a semiconductor light-emitting device 200 comprises a light-emitting structure formed on a transparent carrier 210. The light-emitting structure, as a LED chip, comprises a transparent substrate 220, a first type semiconductor layer 230, and a second type semiconductor layer 250. The first type semiconductor layer 230 and the second type semiconductor 250 are semiconductor materials with different conductivity, such as a p-type and an n-type semiconductors, and form an active layer 240 at the junction thereof. When the light-emitting structure receives a bias, the active layer 240 emits light. In addition, a first electrode 260 and a second electrode 270 electrically connect to the first type semiconductor layer 230 and the second type semiconductor layer 250 respectively for connecting to an outside circuit.

A transparent carrier 210 couples to the underside of the transparent substrate 220. The transparent carrier 210 is independent of the light-emitting structure or the LED chip. In other words, the transparent carrier 210 is not formed during the process of the LED chip manufacture. The transparent substrate 220 comprises a first surface 221 opposite to a second surface 222. The first surface 221 is closer to the active layer 240 than the second surface 222. The transparent carrier 210 comprises a third surface 213 opposite to a fourth surface 214. The third surface 213 is closer to the active layer 240 than the fourth surface 214.

In the preferred embodiment, the area of the transparent carrier 210 is larger than that of the active layer 240. If a mirror or a reflection layer is formed on the underside of the transparent carrier 210, the light from the active layer 240 is reflected. In accordance with the area of the active layer 240 less than that of the transparent carrier 210, reflected light is more likely to emit out from the region of the transparent carrier 210 uncovered by the active layer 240, and relatively, less reflected light returns to the active layer 240. Namely, the light absorbed by the active layer 240 reduces.

Figure 2B:
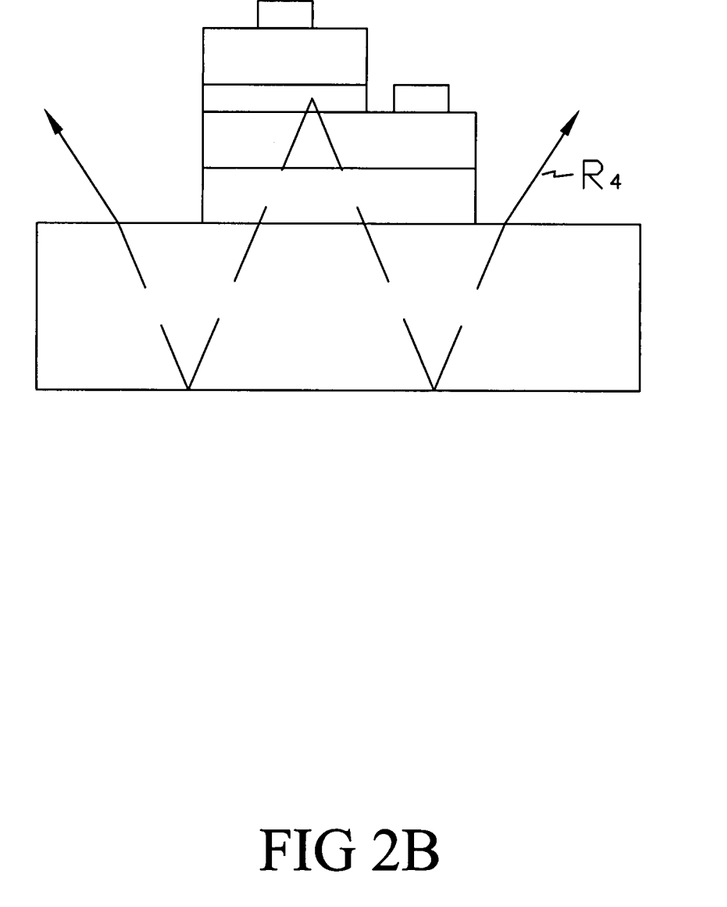
FIG. 2B illustrates a light trace path of the light-emitting semiconductor device in FIG. 2A.

FIG. 2B shows that a fourth ray R4 emits from the active layer 240 to the underside of the transparent carrier 210 and is reflected to the lateral side of the transparent carrier 210. Because the transparent carrier 210 is larger than the active layer 240, the fourth ray R4 is less likely to emit directly to the lateral wall of the transparent carrier 210, comparing with well known technologies, and is more likely to emit to the region of the third surface 213 uncovered by the active layer 240. Thus, the probability and the amount of the fourth ray R4 absorbed by the active layer 240 are reduced.

In the preferred embodiment, the area of the third surface 213 of the transparent carrier 210 is no less than each area of the first surface 221 and the second surface 222. In addition, the area of the fourth surface 214 is larger than that of the active layer 240. Preferably, area ratio of the fourth surface 214 to the active layer 240 is no less than 1.6. Namely, when the shapes of the transparent substrate 210 and the active layer 240 are both square, the ratio of their circumferences is about 1.26. Preferably, the area ratio of the transparent carrier 210 to the active layer 240 is between 4~8.

The areas of the third surface 213 and the fourth surface 214 can be different. Preferably, both areas are larger than that of the active layer 240. If the area of the third surface 213 is larger than that of the fourth surface 214, the transparent carrier 210 is an inverted-trapezoid. On the contrary, if the area of the third surface 213 is less than that of the fourth surface 214, the transparent carrier 210 is a trapezoid or a frustum, as shown in FIG. 3A and FIG. 3B.

Figure 3A:
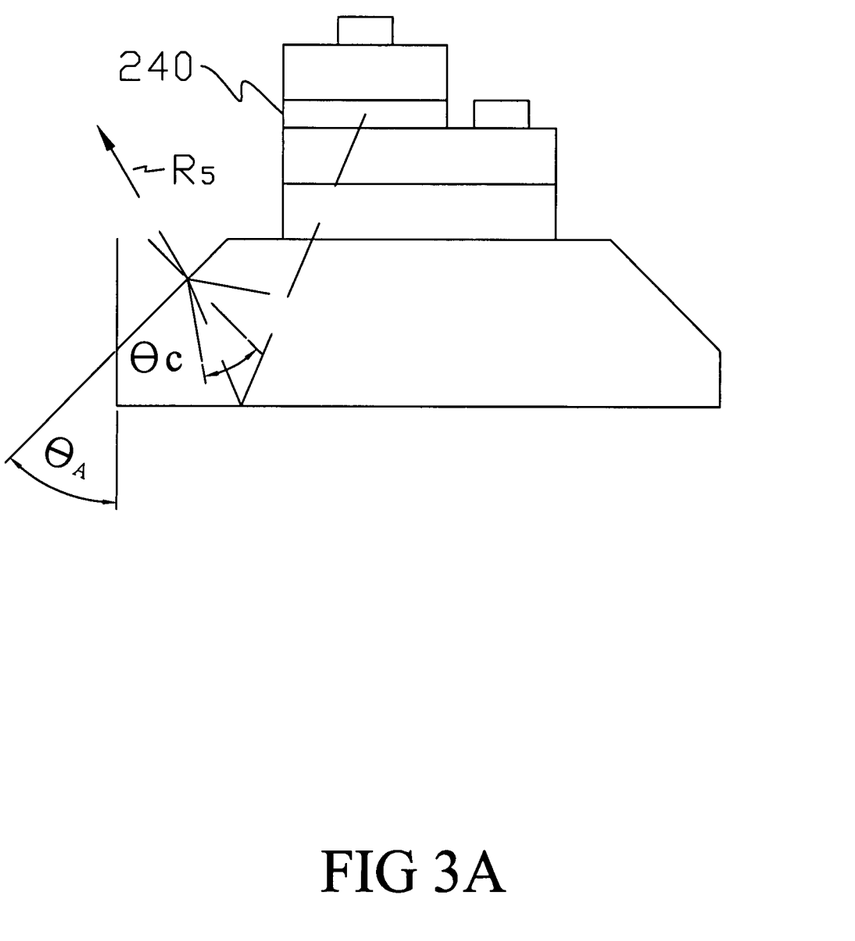
FIGS. 3A-3C are cross-sectional views showing a light-emitting semiconductor device in accordance with another embodiment of the present invention.
Figure 3B:
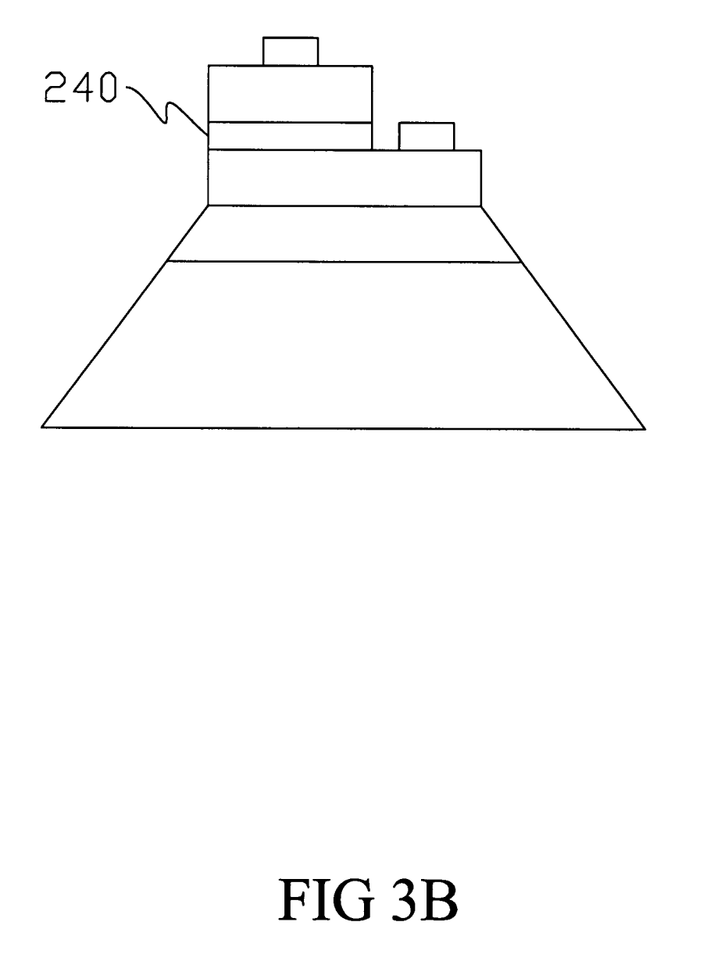

FIG. 3A shows that if the transparent carrier 210 is a trapezoid or a frustum, the lateral surface of that is a ramp. In this embodiment, because of the ramp inclining in an angle $\Theta_A$, a fifth ray R5 is easier to enter the range of a critical angle $\Theta_C$ to escape from the transparent carrier 210. Detailed explanation refers to Taiwan patent application of No. 095103659.

The areas between the first surface 221 and the fourth surface 214 can extend gradually. FIG. 3B shows that outlines of the transparent substrate 220 and the transparent carrier 210 as a whole are trapezoid. As mentioned above, it also aids light to escape from the lateral surfaces of the transparent substrate 220 and the transparent carrier 210.

Figure 3C:
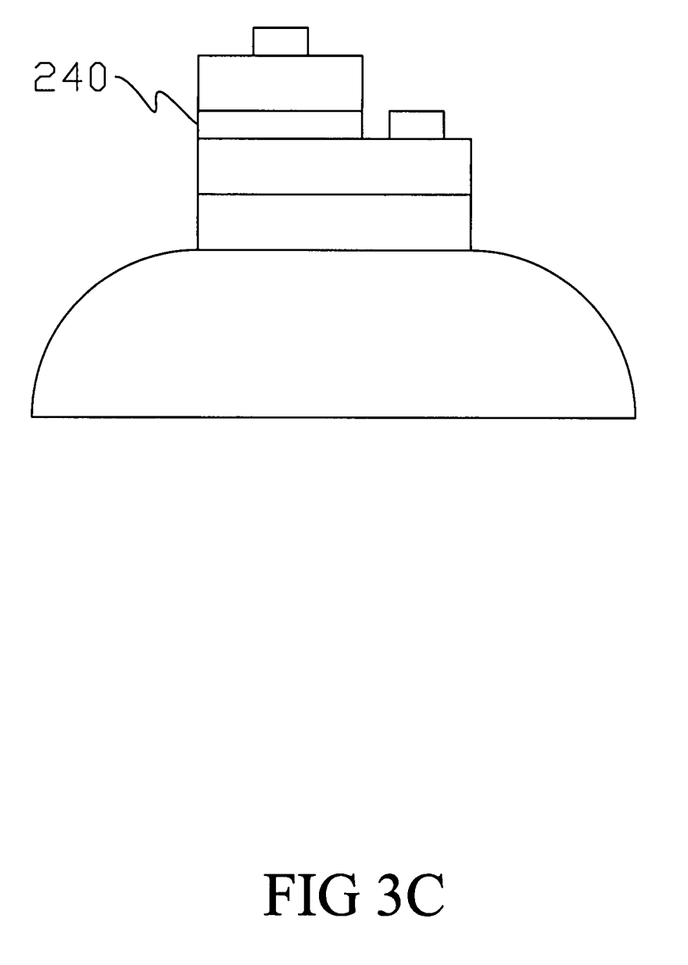

FIG. 3C shows that the lateral surface of the transparent carrier 210 is not limited to a flat surface, and can be a cambered surface as well. A lateral cambered surface also aids light to escape from the lateral surface of the transparent carrier 210.

As mentioned above, the areas of the first surface 221 and the second surface 222 are able to be different. However, both areas must be less than the area of the third surface 213. If the area of the first surface 221 is larger than that of the second surface 222, the transparent substrate 220 is an inverted-trapezoid. On the contrary, if the area of the first surface 221 is less than that of the second surface 222, the transparent substrate 220 is a trapezoid. Both these two shapes respectively aid light reflected to the active layer 240 in certain angles to escape from the light-emitting structure. The selection of the shapes is in accordance with the thickness of the transparent substrate 220.

Figure 4:
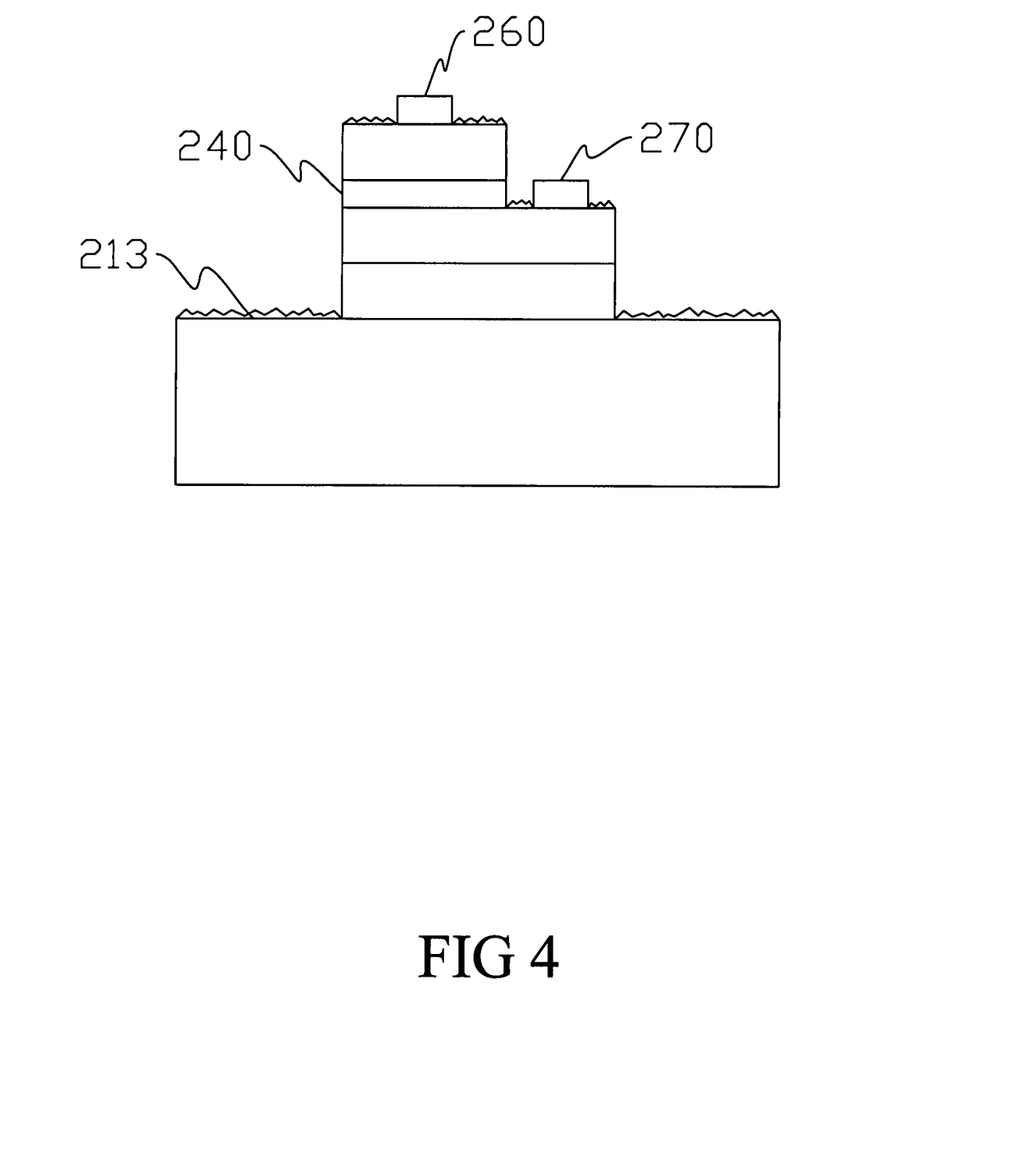
FIG. 4 is a cross-sectional view showing a light-emitting semiconductor device in accordance with another embodiment of the present invention.

When light illuminates an interface between the transparent carrier 210 and environment air, it is possible to encounter a total reflection problem. If the interface is rough or uneven, the light is scattered, and therefore the total reflection is reduced and light extraction efficiency is enhanced. FIG. 4 shows that the region of the third surface 213 uncovered by the active layer 240 is roughened. Besides the third surface 213, the lateral surface of the transparent carrier 210 can also become a rough surface. In addition, a surface contacting electrodes 260 or 270, or contacting both of them but uncovered by them, is roughened as well in order to enhance light extraction efficiency.

If the transparent substrate 220 is a sapphire, the first type semiconductor layer 230 and the second type semiconductor layer 250 can be composed of III-V nitride semiconductor. Because the sapphire is an insulator, the first electrode 260 and the second electrode 270 are formed on the same side of the light-emitting device to conduct the current.

Materials of the transparent substrate 220 also can be conductors, such as SiC, GaP, GaAsP, or ZnSe. At this time, the corresponding materials of the first type semiconductor layer 230 and the second type semiconductor layer 250 are AlGaInP series. By applying the materials mentioned above, the first electrode 260 and the second electrode 270 are located on different sides of the active layer 240 respectively. For some specific structures, the first electrode 260 and the second electrode 270 can be located on the same side of the transparent substrate 220 as well.

In addition, by applying AlGaInP series to form the first and second semiconductor layers 230 and 250, the transparent substrate 220 can be attached to the semiconductor layers by gluing. Then the transparent substrate is fixed onto the transparent carrier 210 after removing the growth substrate.

The materials of the transparent substrate comprise, but unrestricted to, SiC, GaP, GaAsP, ZnSe, and CVD diamond. The materials for gluing comprise, but are not restricted to, SOG, silicone, BCB, epoxy, polyimide, PFCB, or the combination thereof.

Light from the active layer 240 has to emit into the transparent carrier 210 through the transparent substrate 220. Therefore, the materials for attaching the transparent substrate 220 with the transparent carrier 210 must be transparent relative to the light from the active layer 240. The materials for gluing comprise, but are not restricted to, SOG, silicone, BCB, epoxy, polyimide, PFCB, or the combination thereof.

Materials of the transparent carrier 210 comprise, but are not restricted to, SiC, GaP, sapphire, GaAsP, ZnSe, diamond, or CVD diamond. Taking CVD diamond as an example, its thermal expansion coefficient is about 1.1 ppm/K, and its thermal conductivity coefficient is about 20.0 W/cmK. Preferably, the difference of the thermal expansion coefficients between the transparent carrier 210 and the transparent substrate 220 is less than or the same as $1 \times 1^{5/\circ}$ C. Thus, the peeling between the transparent carrier 210 and the transparent substrate 220 because of the heat is avoided.

Figure 5A:
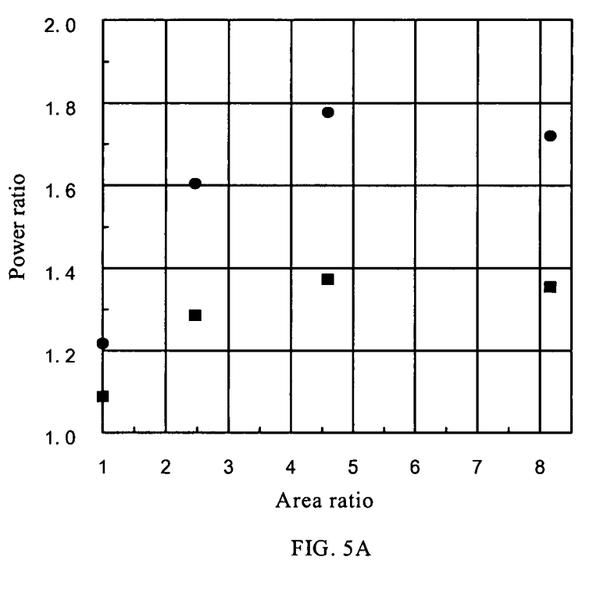
FIGS. 5A and 5B illustrate the area ratio and power ratio of a light-emitting semiconductor device in accordance with the present invention.
Figure 5B:
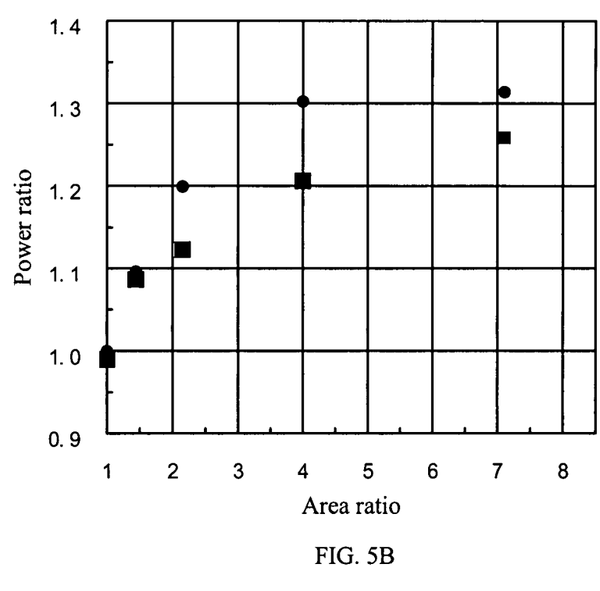

FIGS. 5A and 5B show graphs of area ratio and power ratio of the LED chips of different wavelengths relative to the transparent carrier 210.

Naked yellow-light chips of 14 mil with a primary wavelength of about 593 nm are fixed on sapphire carriers of 14 mil, 22 mil, 30 mil, and 40 mil respectively by applying BCB. Round dots of FIG. 5A show that when the area ratio of the sapphire carrier to the naked yellow-light chip reaches 4.6 times, comparing to the naked yellow-light chip without a transparent carrier attached, the power of the naked yellow-light chip attached to the sapphire carrier raises 1.8 times. Square dots of FIG. 5A show that when the naked yellow-light chip is covered by epoxy, the power of the naked yellow-light chip attached to the sapphire carrier raises 1.4 times. In the meantime, the thickness of the sapphire carrier is about 120 μm Naked blue-light chips of 15 mil with a primary wavelength of about 593 nm are fixed on sapphire carriers of 14 mil, 22 mil, 30 mil, and 40 mil respectively by applying BCB. Round dots of FIG. 5B show that, comparing to the naked blue-light chip without a transparent carrier attached, the power of the naked blue-light chip attached to the sapphire carrier can be raised. In present experiments, the power ratio exceeds 1.3 times. Square dots of FIG. 5B show that when the naked blue-light chip is covered by epoxy, the power of the naked blue-light chip attached to the sapphire carrier raises 1.25 times. In the meantime, the thickness of the sapphire carrier is about 120 μm.

Figure 6:
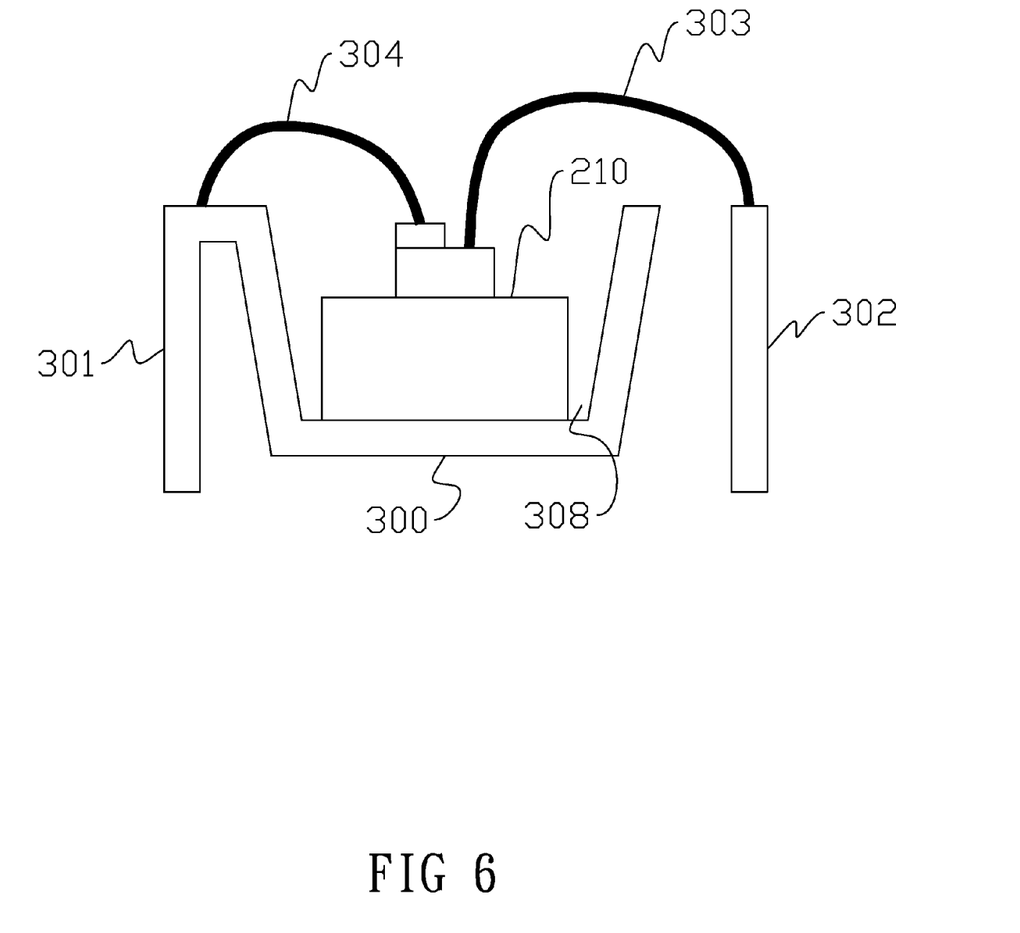
FIG. 6 shows a drawing of an encapsulant structure of the light-emitting semiconductor device.

The structure mentioned above is suitable to an LED encapsulant. FIG. 6 shows that the completed light-emitting structure and the transparent carrier 210 are fixed on a base 300 by silver glue or scotch glue (not shown here). A space 308 may be formed between the transparent carrier 210 and the base 300. The reflection layer (not shown here) is formed under the transparent carrier 210 to reflect light. An anode and a cathode are connected to an anode support 302 and a cathode support 301 by a first conductive wire 303 and a second conductive wire 304. The structure mentioned above can also be covered by the encapsulant materials. A phosphor is doped into the encapsulant materials or covers the LED chip to convert the original color light of the LED chip. The encapsulant materials comprise, but unrestricted to, epoxy, acrylic, silicon, or the combination thereof.

In the encapsulant structure mentioned above, the transparent carrier 210 is set on the base 300 and attaches to the light-emitting structure then. Thus, the commercial LED chips available in the market can be applied to the light-emitting device as shown in abovementioned embodiments.

In accordance with the economic consideration, a backlight module is looking forward lighting, thinning, low power consumption, great luminance and low cost. Therefore, the light-emitting device and the encapsulant structure mentioned above are applicable to the backlight module.

It should be noted that the proposed various embodiments are not for the purpose to limit the scope of the invention. Any possible modifications without departing from the spirit of the invention may be made and should be covered by the invention.

What is claimed is:

1. A semiconductor light-emitting device, comprising:
   a light-emitting structure comprising an active layer capable of emitting light and located between a first type semiconductor layer and a second type semiconductor layer, and a transparent substrate on the first type semiconductor layer, having a first surface and a second surface opposite to the first surface, wherein the first surface is closer to the active layer than the second surface;
   a transparent carrier located on the second surface of the transparent substrate for carrying the light-emitting structure and distinguishing from the light-emitting structure, having a third surface and a fourth surface opposite to the third surface, wherein the third surface is closer to the active layer than the fourth surface, wherein light emitting from the active layer is capable of escaping from a lateral surface of the transparent carrier; and
   a reflection layer located on the fourth surface;
   wherein the light-emitting structure is projected from the transparent carrier, the area of the third surface is not less than each area of the first surface and the second surface and an area ratio of the fourth surface to the active layer is between 4 and 8.

2. The semiconductor light-emitting device according to claim 1, wherein the transparent substrate is attached to the first type semiconductor layer or the second type semiconductor layer by a material transparent relative to the light from the active layer.

3. The semiconductor light-emitting device according to claim 1, wherein the area of the first surface is not less than that of the active layer, and the area of the second surface is not less than that of the active layer.

4. The semiconductor light-emitting device according to claim 1, wherein the area of the fourth surface is greater than that of the third surface, the area of the third surface is greater than that of the second surface, and the area of the second surface is greater than that of the first surface.

5. The semiconductor light-emitting device according to claim 1, wherein the area of the second surface is greater than that of the first surface, the area of the fourth surface is greater than that of the third surface, and the area of the second surface and the third surface are essentially the same.

6. The semiconductor light-emitting device according to claim 1, wherein a portion of the third surface uncovered by the light-emitting structure comprises an uneven surface.

7. The semiconductor light-emitting device according to claim 1, wherein a portion of the third surface uncovered by the light-emitting structure comprises a rough surface.

8. The semiconductor light-emitting device according to claim 1, wherein the light-emitting structure further comprises two electrodes located on the same side and electrically connecting to the first type semiconductor layer and the second type semiconductor layer.

9. The semiconductor light-emitting device according to claim 8, wherein a surface of the light-emitting structure, adjacent to and uncovered by the electrodes, comprises an uneven surface.

10. The semiconductor light-emitting device according to claim 8, wherein a surface of the light-emitting structure, adjacent to and uncovered by the electrodes, comprises a rough surface.

11. The semiconductor light-emitting device according to claim 1, wherein the transparent carrier is a frustum.

12. The semiconductor light-emitting device according to claim 1, wherein the transparent carrier comprises a lateral cambered surface.

13. The semiconductor light-emitting device according to claim 1, wherein a difference between the thermal expansion coefficient of the transparent substrate and that of the transparent carrier is not greater than $1 \times 10^{-5}/°C$.

14. The semiconductor light-emitting device according to claim 1, wherein materials of the transparent substrate are selected from the group consisting of sapphire, SiC, GaP, GaAsP, ZnSe, and CVD diamond.

15. The semiconductor light-emitting device according to claim 1, wherein materials of the transparent carrier are selected from the group consisting of sapphire, SiC, GaP, GaAsP, ZnSe, diamond and CVD diamond.

16. The semiconductor light-emitting device according to claim 1, wherein the size of the transparent carrier is larger than or equal to 14 mil and smaller than or equal to 40 mil.

17. The semiconductor light-emitting device according to claim 1, wherein the thickness of the transparent carrier is about 120 μm.

18. The semiconductor light-emitting device according to claim 1, further comprising a base coupled to the transparent carrier, and a space formed between the transparent carrier and the base.

19. A backlight module, comprising:
a light-emitting structure comprising an active layer capable of emitting light and located between a first type semiconductor layer and a second type semiconductor layer and a transparent substrate located on the first type semiconductor layer, having a first surface and a second surface opposite to the first surface, wherein the first surface is closer to the active layer than the second surface;
a transparent carrier located on the second surface of the transparent substrate for carrying the light-emitting structure and distinguishing from the light-emitting structure, having a third surface and a fourth surface opposite to the first surface, wherein the third surface is closer to the active layer than the fourth surface, wherein light emitting from the active layer is capable of escaping from a lateral surface of the transparent carrier;
a reflection layer located on one side of the transparent carrier opposite to the light-emitting structure;
a base coupled to the transparent carrier;
an anode support connected to the base; and
a cathode support connected to the base;
wherein the transparent substrate is attached to the transparent carrier by a material transparent relative to light from the active layer;
wherein the area of the third surface is not less than each area of the first surface and the second surface, and the area ratio of the fourth surface to the active layer is between 4 and 8;
wherein an anode and a cathode of the light-emitting structure are electrically connected to the anode support and the cathode support.

20. The semiconductor light-emitting device according to claim 19, wherein the transparent carrier comprises at least a surface closer to the base than the light-emitting structure.

* * * * *